United States Patent
Vaughn et al.

(10) Patent No.: US 9,653,230 B1
(45) Date of Patent: May 16, 2017

(54) PUSH PLATE, MOUNTING ASSEMBLY, CIRCUIT BOARD, AND METHOD OF ASSEMBLING THEREOF FOR BALL GRID ARRAY PACKAGES

(71) Applicant: Sandia Corporation, Albuquerque, NM (US)

(72) Inventors: Mark R. Vaughn, Albuquerque, NM (US); Stephen Montague, Albuquerque, NM (US)

(73) Assignee: Sandia Corporation, Albuquerque, NM (US)

(*) Notice: Subject to any disclaimer, the term of this patent is extended or adjusted under 35 U.S.C. 154(b) by 286 days.

(21) Appl. No.: 13/767,578

(22) Filed: Feb. 14, 2013

Related U.S. Application Data

(60) Provisional application No. 61/599,321, filed on Feb. 15, 2012.

(51) Int. Cl.
H01R 13/62 (2006.01)
H01H 13/50 (2006.01)
H05K 3/30 (2006.01)
H01R 13/639 (2006.01)

(52) U.S. Cl.
CPC ............ *H01H 13/50* (2013.01); *H05K 3/303* (2013.01); *H01R 13/62* (2013.01); *H01R 13/639* (2013.01)

(58) Field of Classification Search
CPC ... H01R 13/62; H01R 13/639; H01R 2107/00
USPC .......... 200/534; 439/8, 66, 331, 73; 73/827, 73/842
See application file for complete search history.

(56) References Cited

U.S. PATENT DOCUMENTS 5,221,209 A * 6/1993 D'Amico .................. 439/71
8,221,135 B2 * 7/2012 Chang ....................... 439/71

* cited by examiner

Primary Examiner — Renee Luebke
Assistant Examiner — Ahmed Saeed
(74) Attorney, Agent, or Firm — Daniel J. Jenkins

(57) ABSTRACT

A push plate that includes springs in the form of cantilever flexures and an inspection window is disclosed. The push plate provides a known, uniform, down force and minimal torque to a package to be tested. The cantilevers have a known, calculable down force producing stiffness. The window provides for viewing of the package during testing.

15 Claims, 6 Drawing Sheets

PUSH PLATE, MOUNTING ASSEMBLY, CIRCUIT BOARD, AND METHOD OF ASSEMBLING THEREOF FOR BALL GRID ARRAY PACKAGES

CROSS-REFERENCE TO RELATED APPLICATIONS

This application claims priority to U.S. Provisional Patent Application 61/599,321, entitled "PUSH PLATE, MOUNTING ASSEMBLY, CIRCUIT BOARD, AND METHOD OF ASSEMBLING THEREOF FOR BALL GRID ARRAY PACKAGES," filed Feb. 15, 2012, the specification thereof is incorporated herein by reference in the entirety.

STATEMENT OF GOVERNMENT INTEREST

The United States Government has rights in this invention pursuant to Contract No. DE-AC04-94AL85000 between the United States Department of Energy and Sandia Corporation, for the operation of the Sandia National Laboratories.

FIELD

The present disclosure is generally directed to a device for attaching a ball grid array package assembly to a test socket or printed circuit board, and more particularly to a low profile, controlled force, minimal torque push plate for ball grid array multi-chip module test sockets.

BACKGROUND

Ball grid array (BGA) packages, such as multi-chip modules (MCMs), are small circuit boards that combine several chips, usually a microprocessor and support chips, into one convenient subsystem. BGA packaging is ubiquitous aspect of modern electronic miniaturization and microelectronic systems. BGA packages use a ball grid array (BGA) to make electrical connection with a printed circuit board. The BGA is an improvement over the pin grid array, which is a package with one face covered with pins in a grid pattern. The pins connect the integrated circuit to a printed circuit board (PCB) on which it is placed.

The BGA is a solution to the problem of producing a miniature package for an integrated circuit with many hundreds of pins. Pin grid arrays and dual-in-line surface mount packages are being produced with more and more pins, and with decreasing spacing between the pins. As package pins get closer together, the danger of accidentally bridging adjacent pins with solder increases. BGAs solve this problem.

FIG. 1 illustrates a typical BGA package 100. As can be seen in FIG. 1, the pins are replaced by a ball grid array 105 formed of balls of solder 110 on the bottom 115 of the BGA package 100. The bottom 115 of the BGA package 100 is the bottom surface of a device, such as, but not limited to a MCM.

The device is assembled on a PCB with copper pads (not shown) in a pattern that matches the solder balls 110. The assembly is heated, melting the solder balls 110 to the PCB. Surface tension holds the molten solder and the package in alignment with the circuit board while the solder cools and solidifies.

There are several reasons for directly probing a ball grid array package prior to melting the BGA solder balls. Existing sockets for BGAs, often needed during development, burn-in, rework, inspection, troubleshooting, and testing tend to be unreliable. There are two common types of socket. The more reliable type has spring pins, commonly referred to as "pogopins", that push up under the balls. The less reliable type is a ZIF socket, with spring pinchers that grab the balls. Neither of these systems work well, without sufficient uniform downward force applied to the MCM package or integrated circuit, especially if the balls are small.

FIG. 2 illustrates a typical test socket assembly 200. The test socket assembly 200 includes a test pad 210, an interlock portion 215, electrical connections 216 that lead from the test pad 210 to an analysis device (not shown), and a push plate 220. The test pad 210 includes a plurality of pins 212 for receiving a ball grid array of a device to be tested. The test pad 210 may include a removable package holder (not shown, see FIG. 5), that positions the device or package to be tested upon test pad 210. The interlock portion 215 is where the push plate 220 is attached to the test socket assembly 200. The interlock portion 215 includes protrusions 217 for engaging the push plate 220.

The push plate 220 includes openings 221 for receiving and engaging the protrusions 217. The openings 221 are configured so that when the protrusions 217 are received in the openings 221 and the push plate 220 is rotated, the push plate 220 becomes engaged and/or locked into position with the interlock portion 215. The openings 222 of the push plate 220 may be configured to pull the push plate 220 towards the test pad portion 210 when the push plate 220 is rotated, thus applying a force to the device to push or apply force to the device towards the test pad portion 210 thereby assuring contact between the ball grid array of the device and the pins of the test pad 210.

To test a device, such as a MCM, the device is placed upon test pad 210 with the BGA ball side of the device in contact with the pins of the test pad 210. The push plate 220 is placed upon the device with the protrusions 216 of the interlock portion 215 received in openings 222 of the push plate 220. The push plate 220 is rotated to lock the device into position against the test pad 210.

In other designs, the push plate may be attached to an interlock portion by other attachment methods and devices, such as screws and/or clamps. In still other designs, a push plate may be initially attached to the interlock portion and opened to receive the device to be tested by a clam shell or lever action.

FIGS. 3A and 3B illustrate other typical push plate designs. FIG. 3A illustrates a first push plate 310 that is attached to an interlock portion by screws 312. Knob 314 may be then used to push the test device 316 against the test pad 310. FIG. 3B illustrates a second push plate 350 attached to an interlock portion 352 by screws 354. This type of push plate design may be referred to as a clam shell design. In this design, the second push plate 350 may be opened to receive a device to be tested (not shown) upon the test pad portion 356. The top portion 360 of the second push plate 350 may then be closed to secure the BGA of the device against the pins 362.

These push plates illustrate the root of the problem in using these typical push plates, in that these existing methods to clamp the ball grid array package to the temporary socket are clumsy and block access to the ball grid array package. In some existing push plate designs, there may be a small opening on that socket, but it is for the operator to determine if a chip is installed in the socket without opening the lid.

As discussed above, the ball grid array package must be held against the spring pins, called POGO pins, with the push plate with enough force to make good contact but not with enough force to damage the solder balls or the PCB itself. This holding force must be applied uniformly to the ball grid array package, without large torques, since torques can cause excessive force along an edge or at a corner of the solder ball array, causing damage. Thus, the top holder for the test socket must supply a known, even, down force, without excessive torques. Current push plate designs, for instance the clam-shell design as shown in FIG. 3B fail to apply an even down force.

In addition to these force and torque requirements, there are many instances where physical access to the top of some portion of the ball grid array package chips is needed, for example for failure analysis applications, and this is universally not possible with current sockets, as pointed out previously. Current push plate methods do not allow this access because of the methods used to supply the down force.

Furthermore, push plate assemblies may be used as an installation tool for mounting a ball grid array package onto an application PCB. This application has the same problems associated with the inspection and temporary socket application described above, limited visual access to the ball grid array package and uneven force applied to the mounted ball grid array package.

The need remains, therefore, for a device and method that can attach a ball grid array package, such as a MCM, to a circuit board or test socket that allows for direct probing of the package and that applies an even down force to the package while enabling unfettered access to the top side of the MCM package.

SUMMARY OF THE DISCLOSURE

In an embodiment of the present invention, a push plate is disclosed that provides a known, uniform, down force, minimizes torque, and that does not interfere with access to the top of a ball grid array package, while assembling and/or testing a ball grid array package, hereafter referred to as "package". The package may be a conventional ball grid array package, such as microprocessors, application specific integrated circuits (ASIC), memories and MCMs, used for microprocessors and/or field programmable gate arrays. In an embodiment, the package may be a MCM. In an embodiment, the push plate is used to assemble a package to a socket or PCB that has spring pins that push up under the balls. The push plate has a large viewing window and a minimum thickness so as not to interfere with the visual inspection of the package. The minimum thickness also minimizes interference around the package.

The push plate provides a uniform, down force with minimal torque by suspending a down-load frame with double cantilever flexures. The cantilevers have a known, calculable down force producing stiffness, while providing a calibrated down force. The central slit length of the flexures can be lengthened or shortened to produce the desired torque stiffness and/or to minimize torque. This effect is enhanced by intrinsically doubling the cantilevers geometrically.

An advantage of the present disclosure is to provide a push plate having direct visual access to the package.

Another advantage of the present disclosure is to provide a push plate that applies uniform, down force to the package during assembly with the package holder.

Other features and advantages of the present disclosure will be apparent from the following more detailed description of the preferred embodiment, taken in conjunction with the accompanying drawings which illustrate, by way of example, the principles of the disclosure.

BRIEF DESCRIPTION OF THE DRAWINGS

Wherever possible, the same reference numbers will be used throughout the drawings to represent the same parts.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete and will fully convey the scope of the invention to those skilled in the art.

The present disclosure is directed to a push plate having a known down force, minimal torque, that does not interfere with access to the top of a package, and has minimum thickness. This is accomplished by suspending a down load frame with double cantilever flexures. The cantilevers have a known, calculable down force producing stiffness. While providing a calibrated down force, a central slit length can be lengthened or shortened to produce a desired torque stiffness to minimize torque. This effect is enhanced by intrinsically doubling them geometrically.

In an exemplary embodiment, the cantilevers are short, making them stiff, but the double cantilever prevents damage due to torques. Contrasting the above embodiment with the one shown below, the cantilevers are longer, providing greater compliance (less stiffness) for the particular application. The resulting push plate is still quite thin allowing good access to the chips on the package. It also has the needed stiffness and the desired torque minimization. The structure of the pusher plate is easily analyzed with finite element methods, ensuring the needed stiffnesses and at the same time ensuring the needed material strength.

Figure 1:
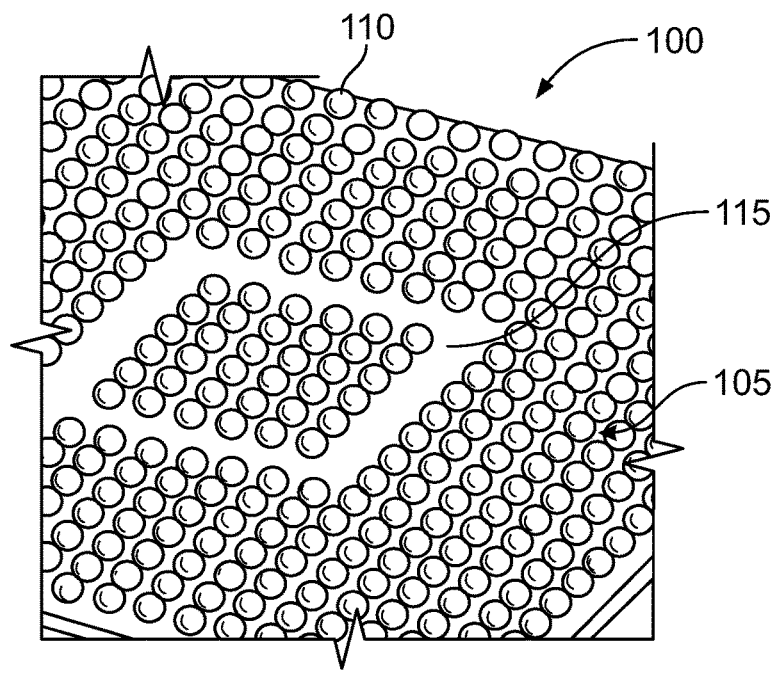
FIG. 1 is a partial view of a typical ball grid assembly.
Figure 2:
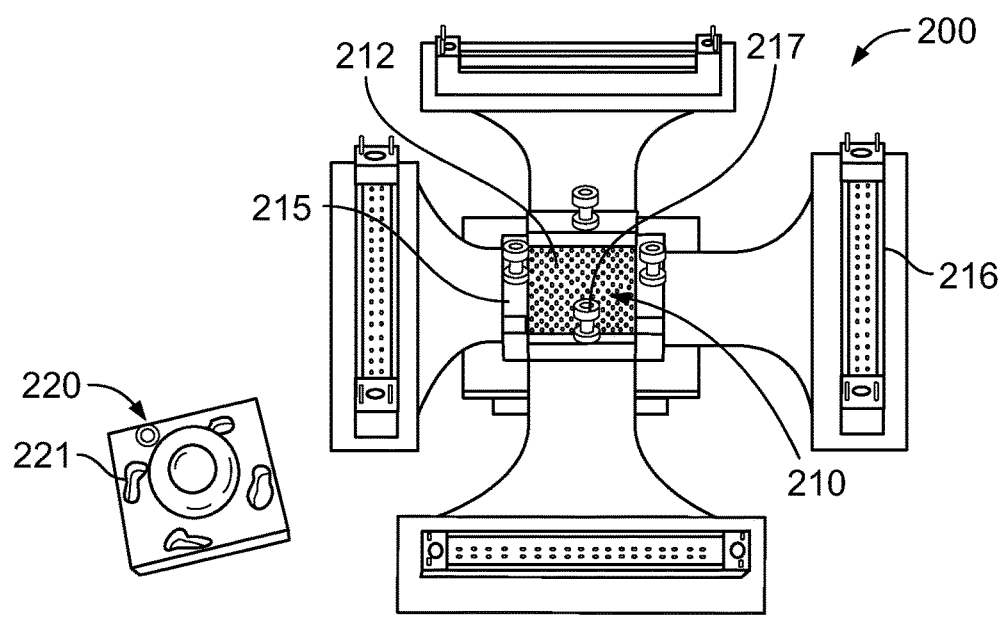
FIG. 2 illustrates a typical test socket assembly.
Figure 3A:
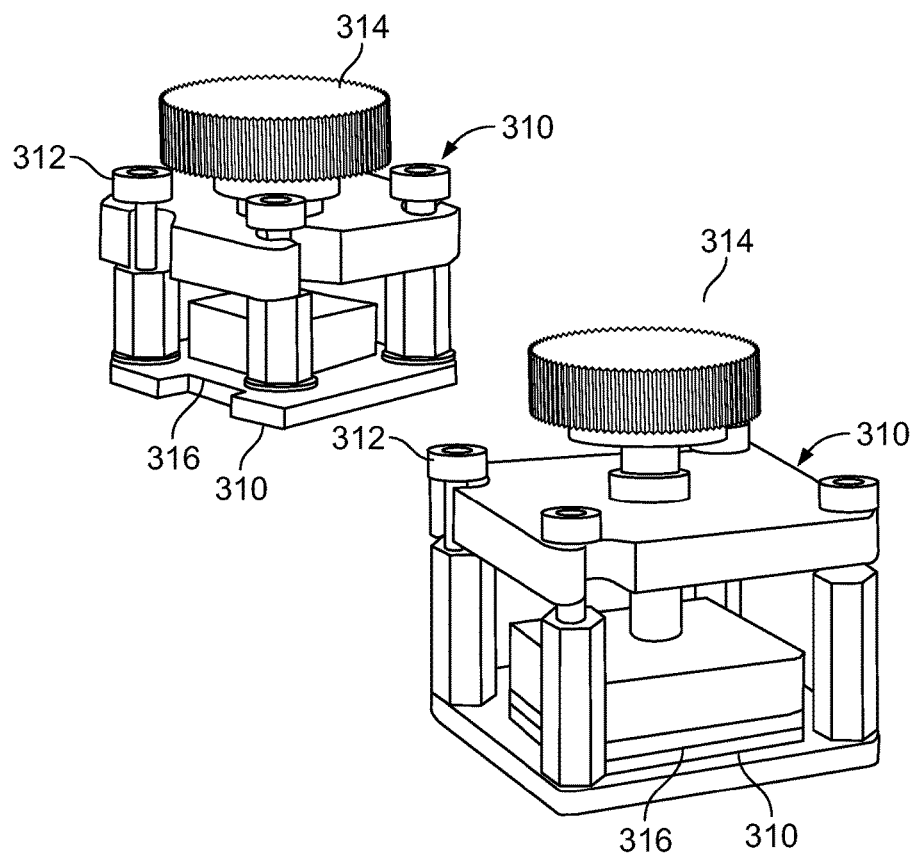
FIG. 3A illustrates a typical push plate assembly.
Figure 3B:
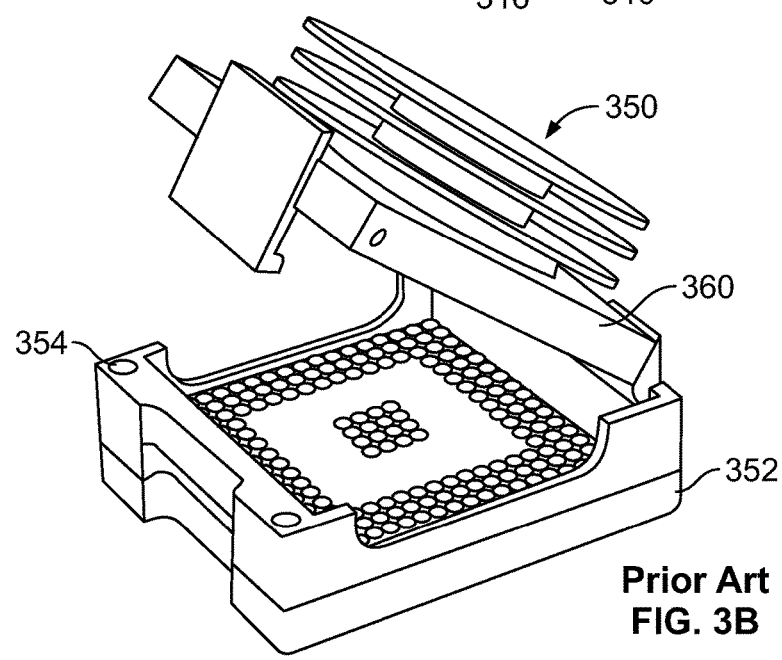
FIG. 3B illustrates another typical push plate assembly.
Figure 4A:
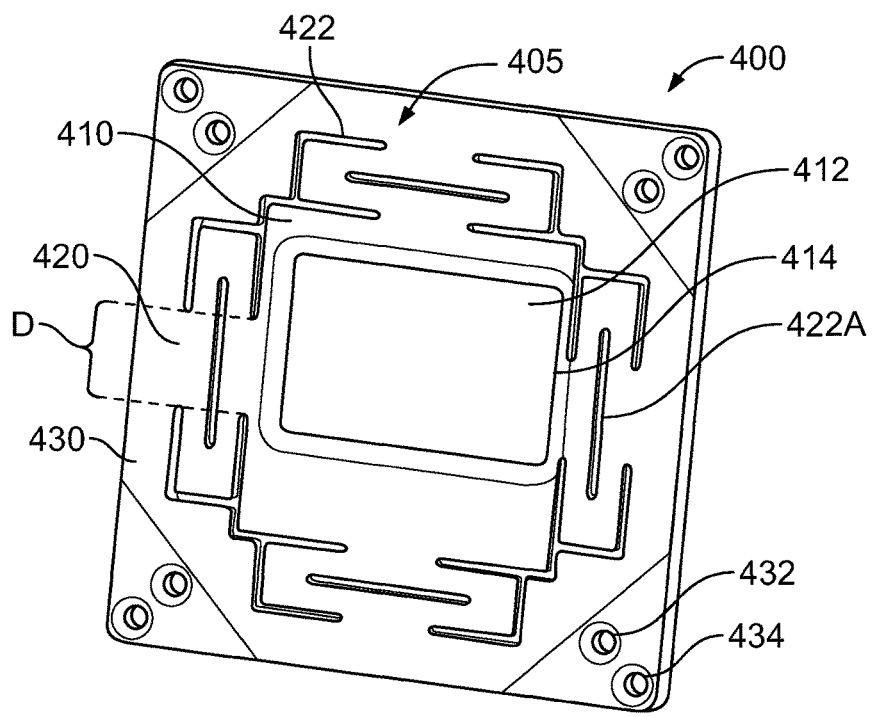
FIG. 4A is a top perspective view of a push plate according to an embodiment of the present disclosure.
Figure 4B:
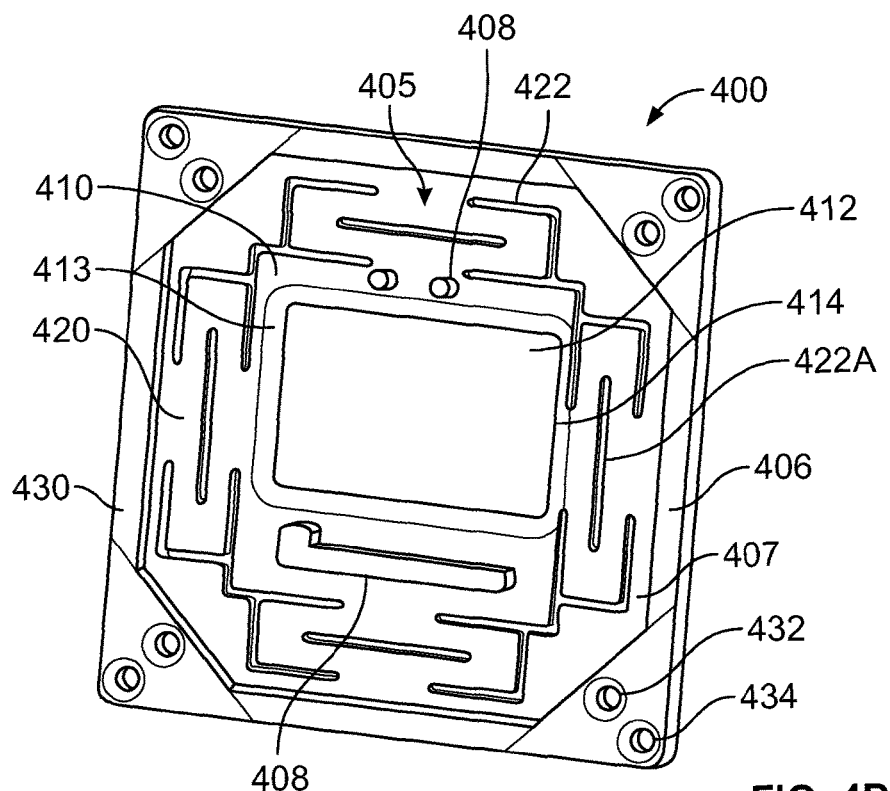
FIG. 4B is a bottom perspective view of a push plate according to an embodiment of the present disclosure.

FIGS. 4A and 4B illustrate an embodiment of a push plate 400 according to the present invention. The push plate 400 provides a known down force, minimal torque, minimal interference with access to the top of a package, and has minimum thickness. As can be seen in FIG. 4A, the push plate 400 includes a top surface 405, a central window portion 410, springs 420, and an outer portion 430. The springs may be referred to as cantilever flexures, flexures, or torsional springs. The outer portion 430 may be referred to as a base or frame.

The central window portion 410 includes an opening 412, which provides visual access to a device to be tested or package (not shown). In this exemplary embodiment, the opening 412 provides visual access to greater than about 50% of the package. In another embodiment, the opening 412 provides visual access to greater than about 20% of the package. In another embodiment, the opening 412 provides visual access to greater than about 75% of the package. In another embodiment, the opening 412 provides visual access to greater than about 90% of the package. In another embodiment, the opening 412 provides visual access to a portion of the package requiring visual inspection.

The springs 420 are configured to apply a known down force with minimal torque to the device to be tested. In this embodiment, this is accomplished by suspending a down load frame with double cantilever flexures. The cantilevers have a known, calculable down force producing stiffness. While providing a calibrated down force, a central slit length can be lengthened or shortened to produce a desired torque stiffness to minimize torque In this embodiment, the push plate 400 includes four springs 420. The springs 420 connect the central window portion 410 to the outer portion 430. In another embodiment, the push plate 420 may include two or more springs 420. For example, a push plate may include one set of opposing springs 420 that are configured to apply a known down force with calculable torque to the device to be tested. In another embodiment, the number and placement of the springs 420 is symmetrical around the opening 412 to apply minimal torque to the device to be tested.

The springs 420 are defined in the push plate by slits 422 that may be increased or decreased in length and/or width and or geometry to control the amount of flex and/or torsion provided by the spring 420. In an embodiment, the slits 422 are designed with a connective distance D that determines a determinable amount of flex and/or torsion by the springs 420.

In this exemplary embodiment, each spring 420 includes one internal slit 422A. The internal slit 422A is designed to tailor the flex and/or torsion provided by the spring 420. In another embodiment, each spring may include one or more internal slits of various geometries. In another embodiment, the internal slit 422A may be omitted in one or more springs 420.

Figure 5:
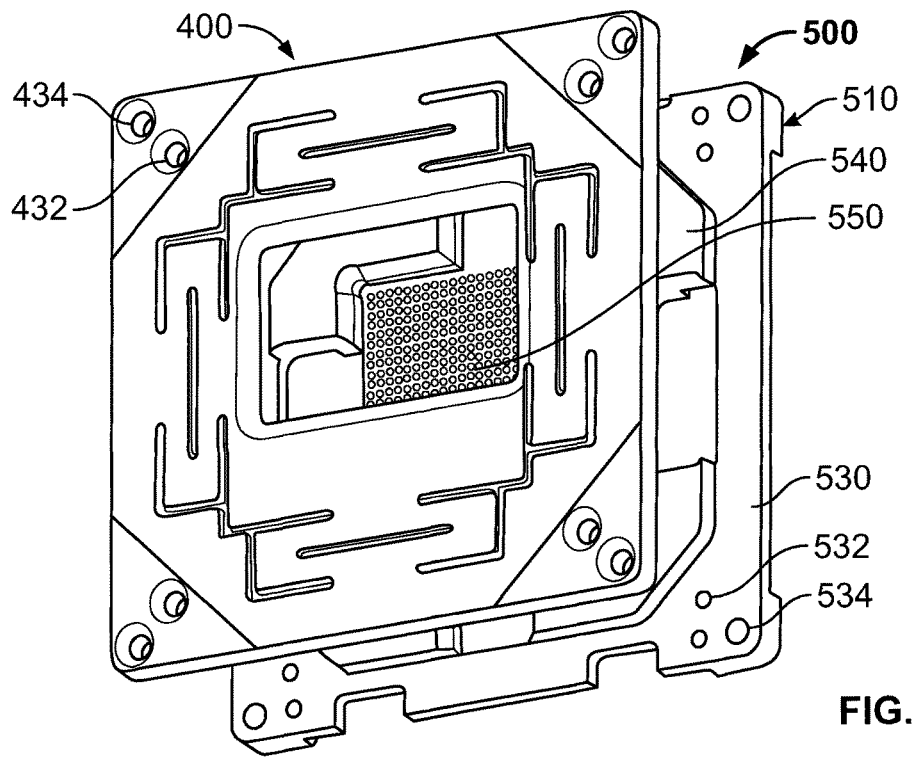
FIG. 5 illustrates a push plate assembly according to an embodiment of the present disclosure.

The frame 430 includes holes 432 that provide access for a screw, bolt or other force adjustable fixture (not shown) to attach the push plate 400 to a package holder test pad or PCB. For example, the push plate may be attached to a package holder 510 as shown in FIG. 5. In this exemplary embodiment, the frame 430 includes four holes 432, one in each corner area of the frame 430. In another embodiment, the frame 430 may include two or more holes 432. In another embodiment, the frame 430 may include holes 432 in areas other than the corners of the frame 430. The holes 432 allow for the fixture to be tightened or loosened to adjust the amount of down force and/or torsion the push plate 400 applies to the package.

The frame 430 also includes holes 434 for attaching the push plate to a test pad and/or PCB. In this exemplary embodiment, the frame 430 includes four holes 434, one in each corner area of the frame 430. In another embodiment, the frame 430 may include two or more holes 434. In another embodiment, the frame 430 may include holes 434 in areas other than the corners of the frame 430.

FIG. 4B shows a bottom view of the push plate 400. As can be seen in FIG. 4B, the push plate 400 includes a bottom surface 405 including a raised frame portion 406 and a recessed portion 407. The recessed portion 407 is sized to receive the device or package to be tested, and the raised frame portion 406 secures the device in position in the recessed portion 407. In this exemplary embodiment, the recessed portion 407 includes raised protrusions 408. In another embodiment, the push plate 400 may include one or more raised protrusions of various shapes and sizes. The shape and size of the protrusions are designed to apply a known down force and torque to the package to be tested and/or to position the package with respect to the push plate. For example, the package may have an uneven surface contacting the push plate. The uneven surface may include resistors and/or other electrical components. In an embodiment, the protrusions allow the push plate to apply force around the electrical components. In another embodiment, the bottom surface 405 may include no protrusions. A push plate with no protrusions may be used when the package is potted and has an even or level surface contacting the push plate.

In this exemplary embodiment, the window 412 is shown surrounded by a beveled frame 413, in another embodiment, the frame 413 may be level with the recessed portion 407.

The push plate 400 is thin, allowing good access to the chips on the package. In an embodiment, the push plate may be less than about 0.75 cm. In another embodiment, the push plate may be less than about 0.50 cm. In yet another embodiment, the push plate may be about 0.4 cm. It also has the needed stiffness and the desired torque minimization.

The push plate 400 may be made of a metal, polymer, plastic, composite, reinforced material or material combination of any thereof. In an embodiment, the push plate 400 is formed of an anodized aluminum. In another embodiment, the push plate is formed of aluminum painted with a non-conducting paint.

The push plate 400 allows access to the entire package area of interest with a high power microscope lens. Typically the 100X lens has a short focal length. It needs to be a few millimeters from the package to be effective. Referring again to FIG. 4A, the push plate 40 compensates for the curvature of the lens housing by including a tapered edge 414 along the opening 412. This allows for a lens to traverse across the entire package without hitting the push plate 400.

FIG. 5 illustrates a push plate assembly 500 according to an exemplary embodiment of the disclosure. As can be seen in FIG. 5, the push plate assembly 500 includes a push plate 400 and a package holder 510. The package holder 510 may be a MCM holder, a conventional ball grid array package used for microprocessors and/or field programmable gate arrays, or other similar ball grid array package.

The package holder 510 includes a frame 530, a recessed portion 540, and a pin array 550. The frame 530 includes holes 534 for receiving fasteners (not shown), such as screws, bolts or other similar fasteners for attaching the push plate assembly 500 to a PCB (not shown). The holes 534 are in alignment with holes 434 of the push plate 400, so in such a manner, attachment fasteners may pass through both the push plate 400 and the MCM holder 510 to attach the push plate assembly 500 to a PCB. In this exemplary embodiment, the frame 530 includes four holes 534, one in each corner area of the frame 530. In another embodiment, the frame 530 may include two or more holes 534. In another embodiment, the frame 530 may include holes 534 in areas other than the corners of the frame 530.

The frame 530 also includes holes 532 for receiving fasteners that pass through holes 432 of the push plate 400. In such a manner, the push plate 400 is attached to the package holder 510. Furthermore, in such a manner, a package may be sandwiched between the push plate 400 and package holder 510, and fasteners can be passed through the holes 432 and holes 532 to attach the push plate 400 to the package holder 510.

The recessed portion 540 corresponds with a select package shape or geometry. The recessed portion 540 includes the pin array 550 that corresponds with a package ball grid array. The push plate 400 also includes a recessed portion (not shown) on the underside (not shown) of the push plate 400 that corresponds with a select package shape or geometry.

Figure 6B:
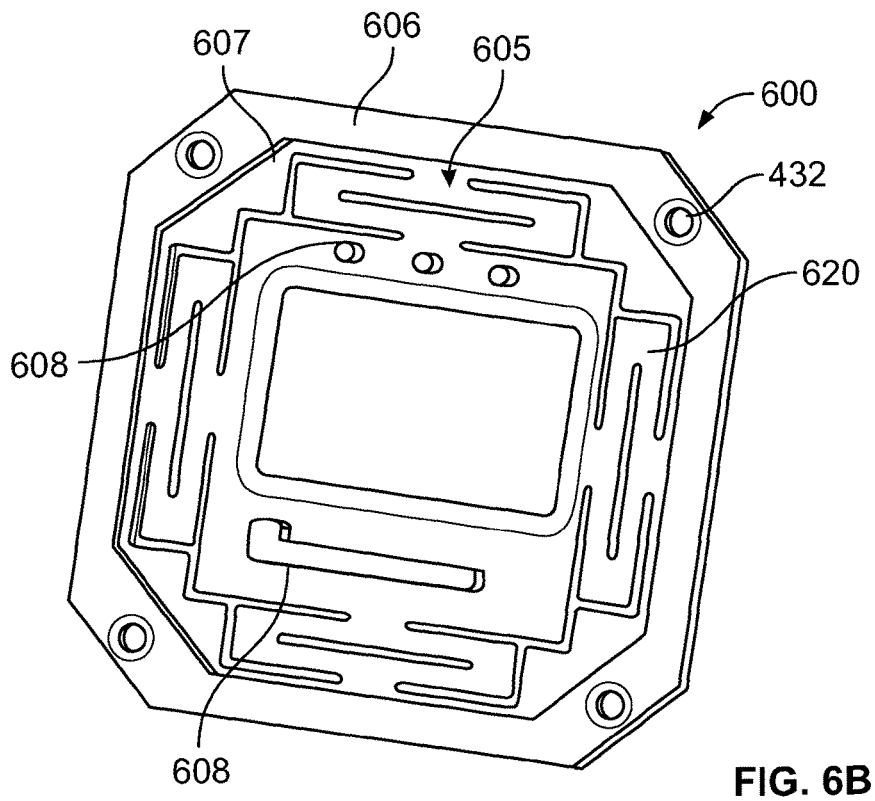
FIG. 6B is a bottom perspective view of another push plate according to an embodiment of the present disclosure.
Figure 6A:
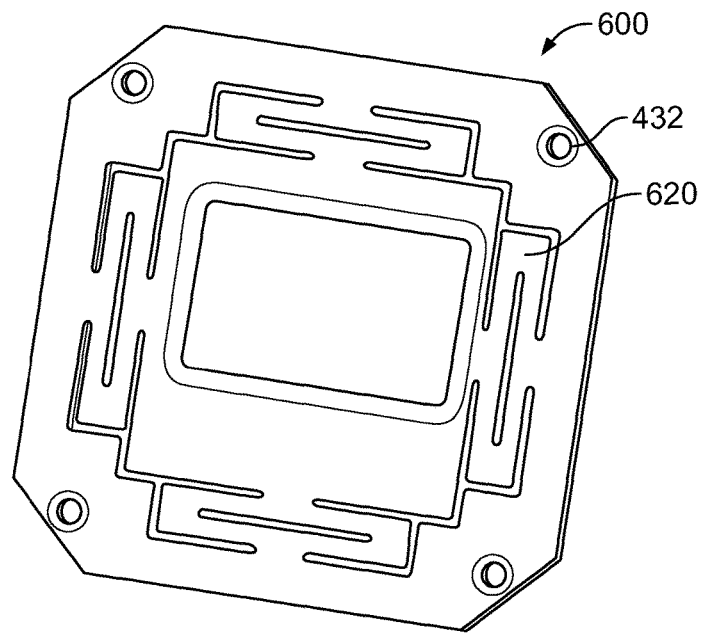
FIG. 6A is a top perspective view of another push plate according to an embodiment of the present disclosure.

FIGS. 6A and 6B illustrate another embodiment of a push plate 600. In this exemplary embodiment, the push plate 600 includes holes 432 for receiving fasteners (not shown) for attaching the push plate 600 to a package holder, test pad or other electrical device. In this exemplary embodiment, the push plate 600 does not include holes 434 for attaching the push plate assembly 500 to a PCB, but instead, the push plate assembly 500 is attached to a pin array device by applying fasteners through holes 534.

FIG. 6B shows a bottom view of the push plate 600. As can be seen in FIG. 6B, the push plate 600 includes a bottom surface 605 including a raised frame portion 606, a recessed portion 607, and protrusions 608. The recessed portion 607 is sized to receive the device or package to be tested, and the raised frame portion 606 secures the device in position in the recessed portion 607.

Comparing push plate 400 and push plate 600, it can be seen that the springs 420 of push plate 400 are shorter than the springs 620 of push plate 600, making them stiffer. However, the double cantilever prevents damage due to torques. Contrasting springs 420 and springs 620, the cantilevers are longer, providing greater compliance (less stiffness) for the particular application.

The structure of the push plate may be analyzed with finite element methods, ensuring the needed stiffnesses and at the same time ensuring the needed material strength. Thus, the essence of the invention is the use of double cantilevers to provide stiffness for down force, torque minimization, and access to the package components both by minimization of thickness and moving the mechanism (the cantilevers) providing the down force to the perimeter, outside the area of the package.

Thus, according to an embodiment of the invention, the use of double cantilevers provides stiffness for down force, torque minimization, and access to the package components both by minimization of thickness and moving the mechanism (the cantilevers) providing the down force to the perimeter, outside the area of the package.

Figure 7:
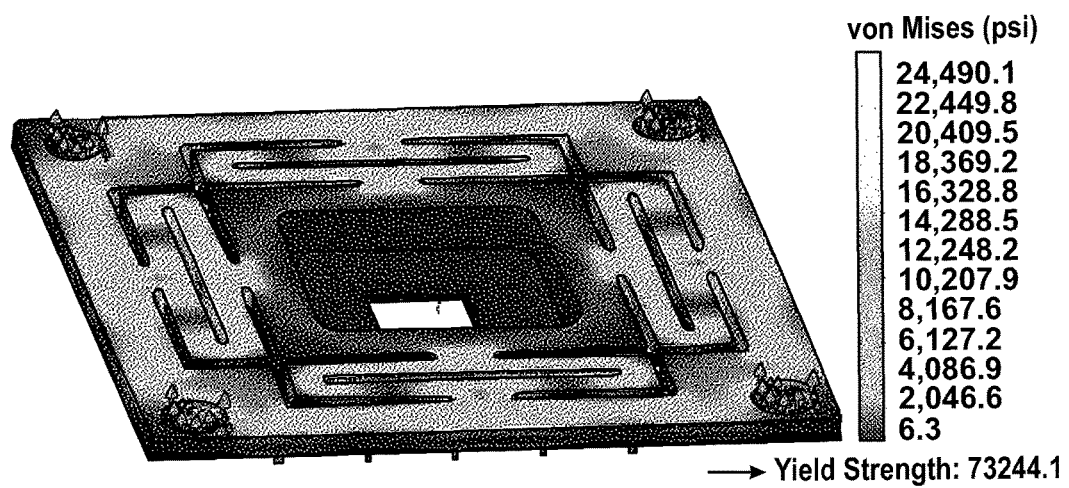
FIG. 7 illustrates the results of a stress analysis of a push plate according to an embodiment of the present disclosure

FIG. 7 illustrates the results of a stress analysis of the push plate 400. As can be seen in FIG. 7, the push plate 400 shows uniform distribution of force across the window portion 410.

Figure 8:
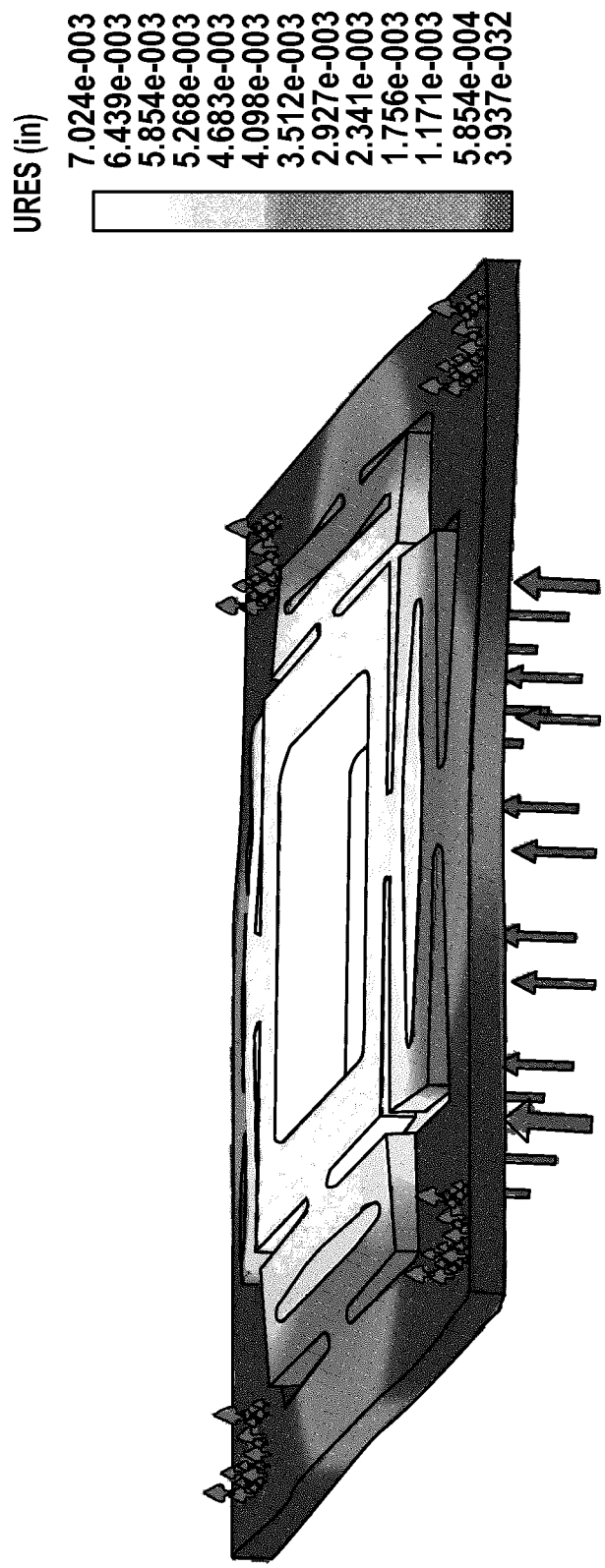
FIG. 8 illustrates the results of a deflection analysis for stiffness according to an embodiment of the present invention.

FIG. 8 illustrates the results of a deflection analysis for stiffness of the push plate 400. As can be seen in FIG. 7, the results show that springs 420 are keeping the window portion 410 flat, resulting in a uniform application of force.

In another embodiment of the present disclosure, a circuit board that includes a push plate assembly is also disclosed. According to this embodiment, a package is attached to a circuit board by using a push plate and optionally a package holder to position the package upon the circuit board for soldering. The push plate may be removed or left to remain in place during circuit board use.

In another embodiment of the present disclosure, a method of inspecting a package while packaged in a push plate assembly is also disclosed. According to this embodiment, the push plate and optionally a package holder are used to attach a device or package, such as a MCM, to a circuit for testing. The package is visually inspected through the window during testing.

The invention being thus described, it will be obvious that the same may be varied in many ways. Such variations are not to be regarded as a departure from the spirit and scope of the invention, and all such modifications as would be obvious to one skilled in the art are intended to be included within the scope of the appended claims. It is intended that the scope of the invention be defined by the claims appended hereto. The entire disclosures of all references, applications, patents and publications cited above are hereby incorporated by reference.

In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A push plate for securing a package to a package holder test pad or printed circuit board, comprising:
    a window portion comprising an opening through the push plate configured to provide access to the package when the push plate is attached to the package holder test pad or printed circuit board;
    a frame portion surrounding the window portion; and
    springs attaching the frame portion to the window portion;
        wherein the springs are configured to flex to allow the window portion to flex within the frame portion to control the amount of torque applied to the package
    wherein the frame portion comprises openings capable of receiving a force adjustable fixture for securing the push plate to the package holder test pad or printed circuit board; and wherein the frame portion is configured to apply a downward force upon the package in a direction towards the package holder test pad or printed circuit board when the push plate is attached to the package holder test pad or printed circuit board.

2. The push plate of claim 1, further comprising:
    a top surface and a bottom surface, the bottom surface comprising a recessed portion and a frame portion to securely position the package to be tested against the push plate.

3. The push plate of claim 1, wherein the springs are defined by slots formed in the push plate.

4. The push plate of claim 1, wherein the push plate includes four springs symmetrically surrounding the window portion.

5. The push plate of claim 1, wherein the springs are cantilever flexures.

6. A push plate assembly for securing a package to a package holder test pad or printed circuit board, comprising:
    a push plate comprising:
        a window portion comprising an opening through the push plate;
        a frame portion surrounding the window portion; and
        springs attaching the frame portion to the window portion; wherein the springs are configured to flex to allow the window portion to flex within the frame portion to control the amount of torque applied to the package and a ball grid array package holder;

wherein the opening is configured to provide access to the package when the push plate is attached to the ball grid array package holder;

and wherein the frame portion is configured to apply a downward force upon the package in a direction towards the package holder test pad or printed circuit board when the push plate is attached to the package holder test pad or printed circuit board.

7. The push plate assembly of claim 5, wherein the push plate further comprises:

a top surface and a bottom surface, the bottom surface comprising a recessed portion to securely position the package to be tested against the push plate.

8. The push plate assembly of claim 5, wherein the springs are defined by slots formed in the push plate.

9. The push plate assembly of claim 5, wherein the push plate includes four springs symmetrically surrounding the window portion.

10. The push plate assembly of claim 5, wherein the springs are cantilever flexures.

11. A method of visually inspecting a multi-chip module, comprising:

disposing a ball grid array package between a push plate and a pin array electrically connected to a printed circuit board; and visually inspecting the ball grid array package through a window in the push plate while attached to the printed circuit board;

wherein the push plate comprises a window portion comprising an opening through the push plate configured to provide access to the package when the push plate is attached to the package holder test pad or printed circuit board;

a frame portion surrounding the window portion; and springs attaching the frame portion to the window portion;

wherein the springs are configured to flex to allow the window portion to flex within the frame portion to control the amount of torque applied to the ball grid array package;

and wherein the frame portion is configured to apply a downward force upon the package in a direction towards the package holder test pad or printed circuit board when the push plate is attached to the package holder test pad or printed circuit board.

12. The method of claim 11, further comprising disposing the ball grid array package holder between the push plate and the printed circuit board.

13. The method of claim 11, further comprising disposing the ball grid array package holder between the ball grid package and the pin array.

14. The method of claim 11, wherein the printed circuit board comprises a test pad.

15. The method of claim 11, wherein the push plate comprises cantilevered flexures that flex when the push plate is attached to the printed circuit board or the ball grid array package holder.

* * * * *